(12) United States Patent
Smith et al.

(10) Patent No.: US 11,562,913 B2
(45) Date of Patent: Jan. 24, 2023

(54) MULTI-ZONE AZIMUTHAL HEATER

(71) Applicant: Watlow Electric Manufacturing Company, St. Louis, MO (US)

(72) Inventors: Kevin Smith, Columbia, MO (US); Paul Valachovic, St. Louis, MO (US)

(73) Assignee: Watlow Electric Manufacturing Company, St. Louis, MO (US)

( * ) Notice: Subject to any disclaimer, the term of this patent is extended or adjusted under 35 U.S.C. 154(b) by 181 days.

(21) Appl. No.: 16/856,634

(22) Filed: Apr. 23, 2020

(65) Prior Publication Data

US 2020/0343112 A1 Oct. 29, 2020

Related U.S. Application Data

(60) Provisional application No. 62/838,535, filed on Apr. 25, 2019.

(51) Int. Cl.
*H01L 21/67* (2006.01)
*H01L 21/687* (2006.01)

(52) U.S. Cl.
CPC .. *H01L 21/67103* (2013.01); *H01L 21/67248* (2013.01); *H01L 21/68785* (2013.01)

(58) Field of Classification Search
CPC ......... H01L 21/67103; H01L 21/67248; H01L 21/68785; H01L 21/68714; H05B 1/0233; H05B 1/0202; H05B 3/03; H05B 3/18; H05B 3/68; C23C 16/45565; C23C 16/4586; H01J 37/3244; H01J 37/32724
See application file for complete search history.

(56) References Cited

U.S. PATENT DOCUMENTS

| | | | | |
|---|---|---|---|---|
| 5,352,864 A | * | 10/1994 | Schultheis | H05B 3/746 219/448.17 |
| 6,225,608 B1 | * | 5/2001 | Kallgren | H05B 3/748 219/465.1 |
| 7,189,946 B2 | * | 3/2007 | Goto | H01L 21/67103 219/544 |
| 8,733,280 B2 | | 5/2014 | Yap et al. | |
| 9,089,007 B2 | * | 7/2015 | Yang | H01L 21/67103 |
| 9,888,528 B2 | * | 2/2018 | Matsushita | H05B 3/26 |
| 2016/0329231 A1 | * | 11/2016 | Parkhe | H05B 1/023 |
| 2019/0013222 A1 | * | 1/2019 | Kim | H01L 21/6831 |
| 2020/0037399 A1 | * | 1/2020 | Zhang | H05B 1/0233 |
| 2021/0022212 A1 | * | 1/2021 | Cimino | H01L 21/67103 |

FOREIGN PATENT DOCUMENTS

| | | | | |
|---|---|---|---|---|
| CN | 102668058 B | * | 4/2015 | ............. C23C 14/10 |
| JP | 2009009795 | | 1/2009 | |
| TW | 200723370 | | 6/2007 | |
| TW | 201831042 | | 8/2018 | |

* cited by examiner

*Primary Examiner* — Mohammed Shamsuzzaman
(74) *Attorney, Agent, or Firm* — Burris Law, LLC

(57) ABSTRACT

A heater assembly and method of controlling the heater assembly is provided. The heater assembly includes a resistive heater and a substrate, and the resistive heater comprises a plurality of heating zones disposed along a perimeter of the substrate. Each of the plurality of heating zones are independently controllable such that azimuthal temperature control of the heater assembly is provided. The plurality of resistive heating elements may be connected in series and have a common ground electrical lead. In the alternative, the plurality of resistive heating elements may each have a ground electrical lead and be isolated from each other.

18 Claims, 3 Drawing Sheets

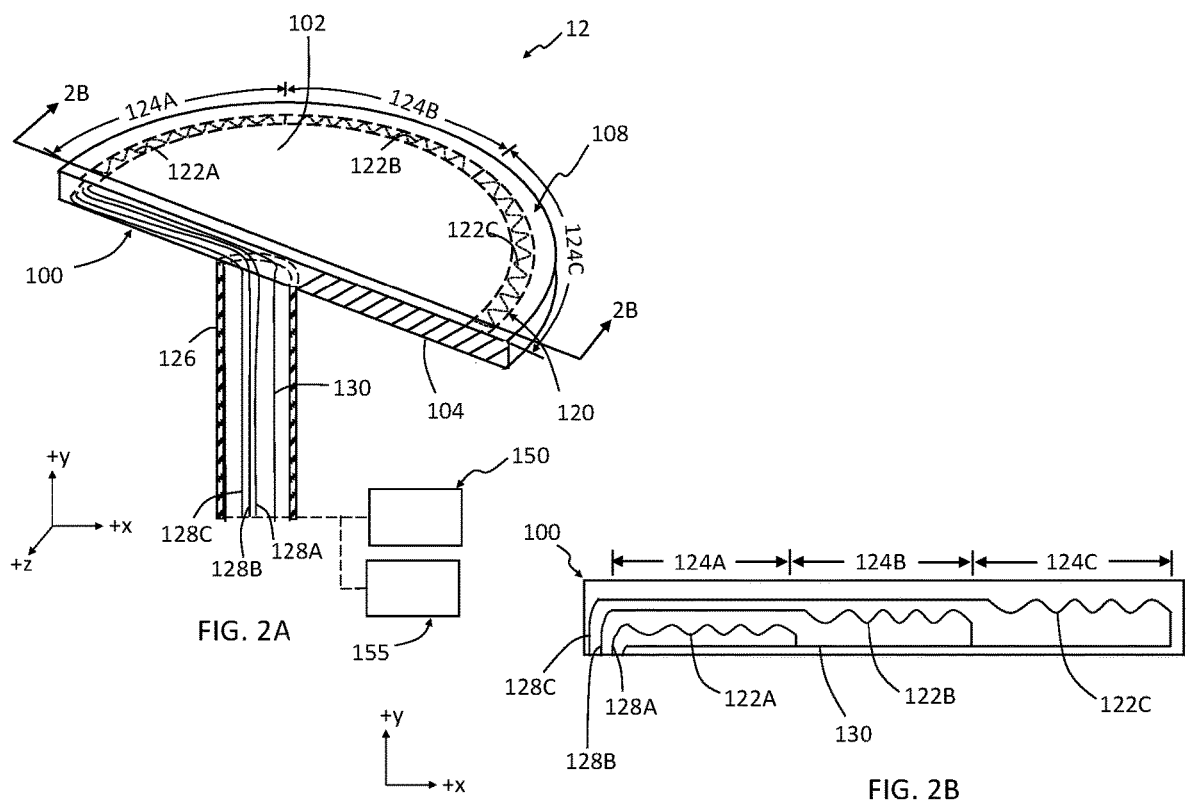

MULTI-ZONE AZIMUTHAL HEATER

CROSS-REFERENCE TO RELATED APPLICATIONS

This application claims priority to and the benefit of U.S. Provisional Application No. 62/838,535 filed on Apr. 25, 2019. The disclosure of the above application is incorporated herein by reference.

FIELD

The present disclosure relates to heater assemblies, and more specifically to heater assemblies having resistive heaters that provide directional thermal control and distribution along a heating target.

BACKGROUND

The statements in this section merely provide background information related to the present disclosure and may not constitute prior art.

Pedestals are known in semiconductor processing to support and heat a wafer disposed thereon. A pedestal generally includes a substrate for supporting a wafer and a shaft member attached to a bottom side of the plate member. A heater may be embedded in the substrate, or otherwise attached to the substrate, to provide the required heating to the wafer. Other devices such as showerheads are also used in semiconductor processing, which distribute process gases (e.g. reactants) across the wafer during processing.

During various wafer processing steps such as plasma enhanced film deposition, or etching, the substrate needs to be uniformly heated or cooled to reduce processing variations within the wafer. However, maintaining uniform azimuthal heating of a perimeter of the substrate may be difficult due to non-uniform heat loss along the perimeter.

The present disclosure addresses the issues related to the uniform azimuthal heating of a substrate, in a variety of applications, among other issues related to heating of a substrate.

SUMMARY

This section provides a general summary of the disclosure and is not a comprehensive disclosure of its full scope or all of its features.

In one form of the present disclosure, a heater assembly comprising a substrate and at least one resistive heater is provided. The at least one resistive heater comprises a plurality of heating zones disposed along a perimeter of the substrate and the plurality of heating zones are independently controllable to provide azimuthal temperature control of the heater assembly. In some variations of the present disclosure, the at least one resistive heater comprises a plurality of resistive heating elements having a common ground. In such variations, the at least one resistive heater comprises n resistive heating elements and n+1 electrical leads. For example, the at least one resistive heater includes a first resistive heating element and a second resistive heating element extending in series along the perimeter of the substrate. A first positive electrical lead is in communication with a positive end of the first resistive heating element, a second positive electrical lead is in communication with a positive end of the second resistive heating element, and a common electrical lead is in communication with a negative end of the first resistive heating element and a negative end of the second resistive heating element. In other variations of the present disclosure, the at least one resistive heater comprises a plurality of resistive heating elements each having a ground electrical lead. In such variations, the plurality of separate resistive heating elements are isolated from each other.

In some variations of the present disclosure, the at least one resistive heater is a cable heater. In other variations of the present disclosure, the at least one resistive heater is a tubular heater, a layered heater, or a foil heater.

In some variations of the present disclosure, the substrate is one piece. In other variations of the present disclosure, the substrate is at least two pieces. Also, in some variations of the present disclosure the at least one resistive heater is embedded within the substrate. In the alternative, or in addition to, the at least one resistive heater is attached to an exterior surface of the substrate. The substrate may be formed from a metal material, a ceramic material, etc., and may be a showerhead or pedestal. In variations of the present disclosure where the substrate is in the form of a pedestal, the electrical leads extend through a shaft of the pedestal.

In some variations of the present disclosure, the heater assembly includes a 2-wire controller operable to independently control the plurality of heating zones. In such variations, the at least one resistive heater defines a material that functions as a heater element and as a temperature sensor.

In at least one variation of the present disclosure, the plurality of resistive heating elements is a plurality of primary resistive heating elements configured to provide primary heating of the substrate. In such variations, the plurality of primary resistive heating elements can provide the only heating of the substrate.

In another form of the present disclosure, a thermal system comprising a controller, a substrate, and at least one resistive heater is provided. The at least one resistive heater includes a plurality of heating zones disposed along a perimeter of the substrate and the plurality of heating zones are independently controlled by the controller to provide azimuthal temperature control of the substrate. In some variations of the present disclosure the controller is a 2-wire controller and the at least one resistive heater is a plurality of resistive heating elements with a common ground wire, a plurality of resistive heating elements with each having a ground wire, or a combination thereof.

In yet another form of the present disclosure, a method for azimuthally heating a substrate includes independently controlling a plurality of heating zones extending along a perimeter of a substrate such that azimuthal temperature control of the substrate is provided. In some variations of the present disclosure, the plurality of heating zones include resistive heating elements selected from a plurality of resistive heating elements with a common ground wire, a plurality of resistive heating elements with each of the plurality of resistive heating elements having a ground wire, and combinations thereof.

Further areas of applicability will become apparent from the description provided herein. It should be understood that the description and specific examples are intended for purposes of illustration only and are not intended to limit the scope of the present disclosure.

DRAWINGS

In order that the disclosure may be well understood, there will now be described various forms thereof, given by way of example, reference being made to the accompanying drawings, in which:

FIG. 2A is a sectional view of a heater assembly in accordance with the teachings of the present disclosure;

FIG. 2B is a cross-sectional view of section 2B-2B in FIG. 2A;

Figure 1:
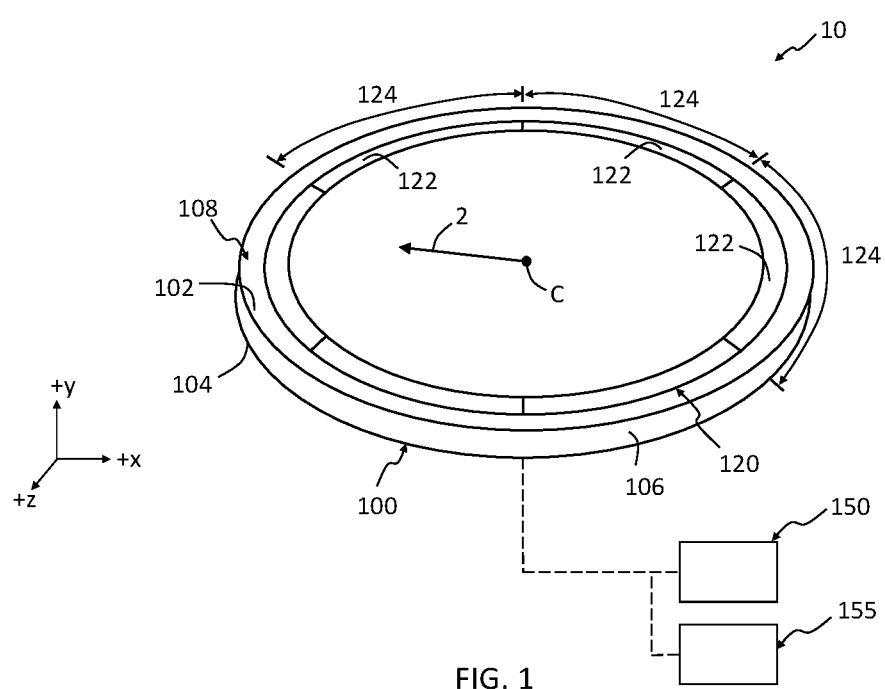
FIG. 1 is a perspective view of a heater assembly in accordance with the teachings of the present disclosure.

The drawings described herein are for illustration purposes only and are not intended to limit the scope of the present disclosure in any way.

DETAILED DESCRIPTION

The following description is merely exemplary in nature and is not intended to limit the present disclosure, application, or uses. It should be understood that throughout the drawings, corresponding reference numerals indicate like or corresponding parts and features. Examples and variations are provided to fully convey the scope of the disclosure to those who are skilled in the art. Numerous specific details are set forth such as types of specific components, devices, and methods, to provide a thorough understanding of variations of the present disclosure. It will be apparent to those skilled in the art that specific details need not be employed and that the examples and variations provided herein, may include alternative forms and are not intended to limit the scope of the disclosure. In some examples, well-known processes, well-known device structures, and well-known technologies are not described in detail.

Referring now to FIG. 1, a heater assembly 10 according to the teachings of the present disclosure is schematically depicted. The heater assembly 10 includes a substrate 100 and at least one resistive heater 120 comprising a plurality of heating elements 122 and corresponding heating zones 124. The substrate 100 has an upper surface 102 (+y-direction), a lower surface 104 (−y-direction), a sidewall 106, and a perimeter 108 adjacent and/or proximate to the sidewall 106. The substrate 100 has a thickness (y-direction) and the sidewall 106 extends between the upper surface 102 and the lower surface 104. As used herein, the term "perimeter" refers to an area or region extending adjacent or proximate to an outer sidewall of a substrate. For example, the plurality of heating elements 122 schematically depicted in FIG. 1 are disposed along the perimeter 108 of the substrate 100. Also, the plurality of heating elements 122 are attached to the upper surface 102 of the substrate 100. As schematically depicted in FIG. 1, the substrate 100 has a circular shape (i.e., a circular cross-section in the x-z plane). However, it should be understood that substrates with different shapes (e.g., rectangular, triangular, elliptical, etc.) are included within the teachings of the present disclosure.

In some variations of the present disclosure, the plurality of heating elements 122, and thereby the plurality of heating zones 124, are independently controllable. In such variations, azimuthal temperature control of the heater assembly 10 is provided. As used herein, the phrase "azimuthal temperature control" refers to temperature control of a substrate along a circumferential direction of the substrate (e.g., along a perimeter of a substrate) as opposed to temperature control along a radial direction of the substrate. As used herein, the phrase "radial direction" refers to a direction from a center of a substrate (e.g., center "C" of substrate 100) to a perimeter of the substrate (e.g., perimeter 108) as schematically depicted by arrow 2 in FIG. 1.

Still referring to FIG. 1, in some variations of the present disclosure, a controller 150, e.g., a two-wire controller, is included and in communication with the heater assembly 10 such that independent control of the plurality of heating elements 122, and thereby independent control of the plurality of heating zones 124, is provided. In such variations, each of the plurality of heating elements 122 define a material that functions as a heater element and as a temperature sensor. Non-limiting examples of two-wire controllers and their materials are disclosed in U.S. Pat. No. 7,196,295 which is commonly assigned with the present application and the disclosure of which is incorporated by reference in their entirety. For example, in some variations of the present disclosure, a power source 155 is provided and configured to provide power to the plurality of heating elements 122, and the controller 150 in the form of a two-wire controller determines the temperature(s) of the plurality of heating elements 122 based on a calculated resistance of the plurality of heating elements 122. Also, the controller 150 sends signals to the power source 155 to control the temperature(s) of the plurality of heating elements 122. In at least one variation of the present disclosure, the controller 150 independently controls power to and the temperature of each of the plurality of heating elements 122.

In operation, electrical current independently flows through each of the plurality of heating elements 122 and the controller 150 monitors the temperature or average temperature of each of the plurality of heating zones 124, and based on temperature (or average temperature) of a given heating zone 124, increases or decreases the electrical current through the corresponding heating element 122 such that the temperature of the given heating zone 124 is increased or decreased, respectively.

Non-limiting examples of resistive heater 120 and other resistive heaters disclosed herein, include a layered heater, a cable heater, a tubular heater, and a foil heater. A layered heater comprises layers of materials applied to a substrate and each layer, also referred to herein as a "heating element", may be formed via laser-etching, thermal-spraying, or injection molding.

In some variations of the present disclosure, the plurality of heating elements 122 is a plurality of main heating elements, i.e., the plurality of heating elements 122 provide the main or primary heating of the substrate 100. In at least one variation, the plurality of heating elements 122 are the only heating elements used for heating of the substrate 100. In at least one other variation, the plurality of heating elements 122 provide the main or primary heating of the substrate 100 and secondary heating elements (not shown) provide secondary heating to a portion of the substrate 100 spaced inwardly from the plurality of heating elements 122 (i.e., in a direction from the perimeter 108 towards the shaft 126).

Referring now to FIGS. 2A and 2B, a cross-section of a heater assembly 12 according to the teachings of the present disclosure is schematically depicted. Similar to the heater assembly 10 in FIG. 1, the heater assembly 12 includes the substrate 100 and at least one resistive heater 120. The at least one resistive heater 120 schematically depicted in FIGS. 2A and 2B includes a plurality of heating elements 122A-122C (also referred to herein as "first heating element 122A", "second heating element 122B", and "third heating element 122C") and corresponding heating zones 124A-124C. Furthermore, the substrate 100 is in the form of a pedestal with a shaft 126 extending from the lower surface 104 of the substrate 100 encompassing electrical leads 128A-128C, 130 (also referred to herein as "first electrical lead 128A", "second electrical lead 128B", "third electrical lead 128C", and "ground electrical lead 130").

Referring particularly to FIG. 2B, the plurality of heating elements 122A-122C are arranged in series with the first electrical lead 128A in communication with a first end (−x-direction) of the first heating element 122A, the second electrical lead 128B in communication with a first end (−x-direction) of the second heating element 122B, the third electrical lead 128C in communication with a first end (−x-direction) of the third heating element 122C, and a common ground electrical lead 130 in communication with second ends (+x-direction) of the first, second, and third heating elements 122A, 122B, 122C. Accordingly, electrical current is applied to or flows through the first heating element 122A via electrical leads 128A and 130, electrical current is applied to the second heating element 122B via electrical leads 128B and 130, and electrical current is applied to the third heating element 122C via electrical leads 128C and 130. It should be understood that applying electrical current to the heating elements 122A-122C in this manner provides independent control of the heating elements and the corresponding heating zones 124A-124C. It should also be understood that applying electrical current to the heating elements 122A-122C in this manner provides azimuthal temperature control of the substrate 100.

In some variations of the present disclosure, the controller 150 is included as schematically depicted in FIG. 2A. The controller 150 is in communication with the heater assembly 12 and is configured to independently control the plurality of heating elements 122A-122C, and thereby independently control the plurality of heating zones 124A-124C. Particularly, the controller 150 is configured to provide controlled heating of the resistive heater 120 by increasing or decreasing the electrical current through the heating elements 122A-122C via electrical leads 128A-128C as described above. In some variations of the present disclosure the controller 150 provides uniform heating of the perimeter 108 of the substrate 100, i.e., the temperatures or average temperatures of the heating zones 124A-124C are generally equal to each other (e.g., within +/−2° C.). In other variations of the present disclosure the controller 150 provides selective heating of the perimeter 108 of the substrate 100, i.e., the temperatures or average temperatures of the heating zones 124A-124C are intentionally not generally equal to each other.

Figure 3A:
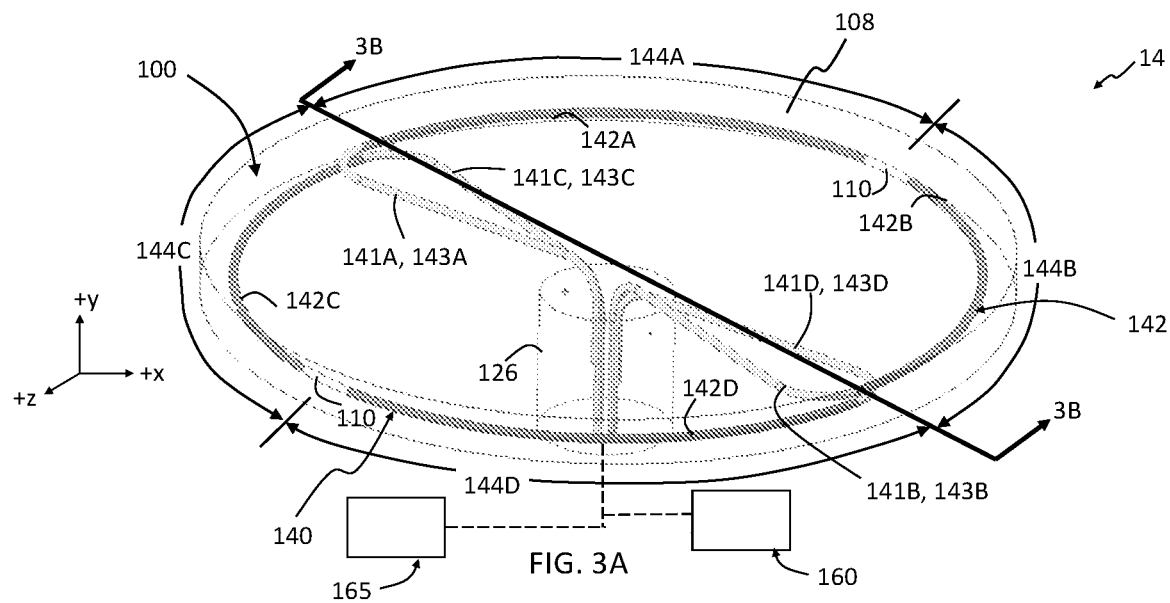
FIG. 3A is a perspective view of a heater assembly in accordance with the teachings of the present disclosure.
Figure 3B:
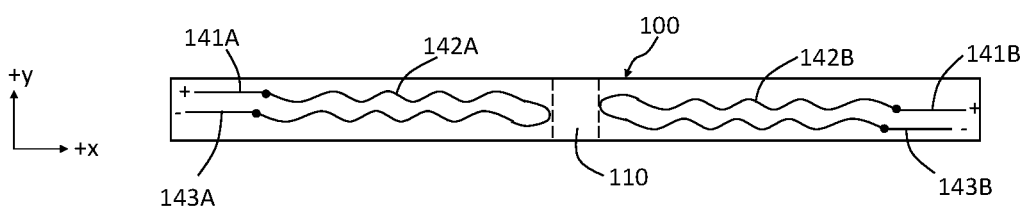
FIG. 3B is a cross-sectional view of section 3B-3B in FIG. 3A.

Referring now to FIGS. 3A and 3B, another heater assembly 14 according to the teachings of the present disclosure is schematically depicted. Similar to the heater assembly 12 in FIGS. 2A-2B, the heater assembly 14 includes the substrate 100 with the shaft 126 and at least one resistive heater 140 disposed within the substrate 100. However, in contrast to the heater assembly 12, the at least one resistive heater 140 comprises a plurality of heating elements 142 each having a ground electrical lead. Particularly, the at least one resistive heater 140 schematically depicted in FIG. 3A includes a plurality of heating elements 142A-142D with corresponding heating zones 144A-144D. Also, and as best shown in FIG. 3B, each of the heating elements 142A-142D (only heating elements 142A and 142B shown in FIG. 3B) has a positive electrical lead 141A-141D, connected to a first end (+y-direction) of the heating elements 142A-142D, respectively, and a negative electrical lead 143A-143D connected to a second end (−y-direction) of the heating elements 142A-142D, respectively. Accordingly, electrical current is applied to or flows through the heating element 142A via electrical leads 141A and 143A, electrical current is applied to the heating element 142B via electrical leads 141B and 143B, electrical current is applied to the heating element 142C via electrical leads 141C and 143C, and electrical current is applied to the heating element 142D via electrical leads 141D and 143D. It should be understood that applying electrical current to the heating elements 142A-142D via electrical leads 141A-141D and 143A-143D provides independent control of the heating elements 142A-142D and the corresponding heating zones 144A-144D. It should also be understood that applying electrical current to the heating elements 142A-142D in this manner provides azimuthal temperature control of the substrate 100.

In some variations of the present disclosure, a controller 160 and a power source 165 are included as schematically depicted in FIG. 3A. The controller 160 is in communication with the heater assembly 14 and is configured to independently control the plurality of heating elements 142A-142D, and thereby independently control the plurality of heating zones 144A-144D. Particularly, the controller 160 is configured to provide controlled heating (via the power source 165) of the resistive heater 140 by increasing or decreasing the electrical current through the heating elements 142A-142D via electrical leads 141A-141D and 143A-143D, respectively, as described above. In some variations of the present disclosure, the controller 160 provides uniform heating of the perimeter 108 of the substrate 100, i.e., the temperatures or average temperatures of the heating zones 144A-144D are generally equal to each other (e.g., within +/−2° C.). In other variations of the present disclosure, the controller 160 provides selective heating of the perimeter 108 of the substrate 100, i.e., the temperatures or average temperatures of the heating zones 144A-144D are intentionally not generally equal to each other.

It should be understood that the controller 160 can be a two-wire controller as described above and in communication with the heater assembly 12 such that independent control of the plurality of heating elements 142A-142D, and thereby independent control of the plurality of heating zones 144A-144D, is provided. In such variations, each of the plurality of heating elements 142A-142D define a material that functions as a heater element and as a temperature sensor.

It should also be understood that the heating elements 142A-142D are isolated from each other. In some variations of the present disclosure, the heating elements 142A-142D are isolated from each by an isolation region 110 of the substrate 100. That is, an isolation region 110 is positioned between each of the heating elements 142A-142D. While four heating elements 142 are shown in FIG. 3A, it should be understood that less than four heating elements 142 or more than four heating elements 142 are within the scope of the present disclosure.

In some variations of the present disclosure, the plurality of heating elements 142A-142D is a plurality of main heating elements, i.e., the plurality of heating elements 142A-142D provide the main or primary heating of the substrate 100. In at least one variation, the plurality of heating elements 142A-142D are the only heating elements used for heating of the substrate 100. In at least one other variation, the plurality of heating elements 142A-142D provide the main or primary heating of the substrate 100 and secondary heating elements (not shown) provide secondary heating to a portion of the substrate 100 spaced inwardly from the plurality of heating elements 142A-142D (i.e., in a direction from the perimeter 108 towards the shaft 126). Such secondary heating elements may include, by way of example, those illustrated and described in U.S. Publication No. 2019/0159291, which is commonly owned with the present application and incorporated herein by reference in its entirety.

It should be understood from the teachings of the present disclosure that a heater assembly for azimuthal heating of a substrate is provided. The heater assembly includes at least one resistive heater comprising a plurality of heating elements disposed along a perimeter of the substrate. Also, the plurality of heating elements are attached to an outer surface of the substrate, disposed within the substrate, or a combination thereof. Applying current to each of the plurality of heating elements provides multiple zone tuning of the heating elements and allows for heat transfer along an azimuthal direction of the substrate. The heat transfer along the azimuthal direction may be either from a center of the at least one resistive heater toward a peripheral end of the at least one resistive heater, or from a peripheral end or the at least one resistive heater toward a center of the at least one resistive heater. The center of the substrate spaced apart from the perimeter of the substrate may have a temperature higher or lower than the temperature of the perimeter.

The heater can be of various types of resistive heaters and is not limited to only resistive heaters such as layered heaters, cable heaters, tubular heaters, and foil heaters. Also, the substrate may include but is not limited to ceramic or metal material and may include one piece or multiple pieces.

The plurality of heating elements may be electrically connected in series such that all of the heating elements have a common ground electrical lead and n heating elements are independently controlled with electrical current flowing through the n heating elements and n+1 electrical leads. In the alternative, the plurality of heating elements may have a positive electrical lead and a negative electrical lead and n heating elements are independently controlled with electrical current flowing through the n heating elements and 2n electrical leads.

A controller may be included and be operable to independently control the plurality of heating zones. The controller may comprise a power source, a voltage and current measurement component, a power regulator component, and a processor in communication with the at least one resistive heater. The processor is also in communication with a communications component, where certain output from the heater assembly (e.g., temperature readings) is delivered and also where input (e.g., updated TCR values, calibration data, temperature set points, resistance set points) may be provided to the heater system. One example of the controller may be a two-wire controller where the resistive heater defines a material that functions as a heater element and as a temperature sensor.

While not shown in the drawings, it should be understood that other components included with pedestals, showerheads, etc., used in semiconductor processing can be included as part of the heater assemblies disclosed herein. Non-limiting examples of such components include routing layers, cooling channels, conductive vias and the like.

Although the terms first, second, third, etc. may be used to describe various elements, components, regions, layers and/or sections, these elements, components, regions, layers and/or sections, should not be limited by these terms. These terms may be only used to distinguish one element, component, region, layer and/or section, from another element, component, region, layer and/or section. Terms such as "first," "second," and other numerical terms when used herein do not imply a sequence or order unless clearly indicated by the context. Thus, a first element, component, region, layer or section, could be termed a second element, component, region, layer or section without departing from the teachings of the example forms. Furthermore, an element, component, region, layer or section may be termed a "second" element, component, region, layer or section, without the need for an element, component, region, layer or section termed a "first" element, component, region, layer or section.

Spacially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above or below. The device may be otherwise oriented (rotated 90 degrees or at other orientations) and the spatially relative descriptors used herein interpreted accordingly.

As used herein, the phrase at least one of A, B, and C should be construed to mean a logical (A OR B OR C), using a non-exclusive logical OR, and should not be construed to mean "at least one of A, at least one of B, and at least one of C.

The terminology used herein is for the purpose of describing particular example forms only and is not intended to be limiting. The singular forms "a," "an," and "the" may be intended to include the plural forms as well, unless the context clearly indicates otherwise. The terms "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

The description of the disclosure is merely exemplary in nature and, thus, examples and variations that do not depart from the substance of the disclosure are intended to be within the scope of the disclosure. Such examples and variations are not to be regarded as a departure from the spirit and scope of the disclosure. The broad teachings of the disclosure can be implemented in a variety of forms. Therefore, while this disclosure includes particular examples and variations, the true scope of the disclosure should not be so limited since other modifications will become apparent upon a study of the drawings, the specification, and the following claims.

What is claimed is:
1. A heater assembly comprising:
a substrate, wherein the substrate is in the form of a pedestal;
at least one resistive heater comprising a plurality of heating zones disposed along a perimeter of the substrate, wherein the plurality of heating zones are independently controllable to provide azimuthal temperature control of the heater assembly and the at least one resistive heater comprises a plurality of resistive heating elements having a common ground electrical lead, wherein the common ground electrical lead is in communication with a common ground;
electrical leads in communication with the plurality of heating zones; and
a shaft secured to and extending from a lower surface of the pedestal, the shaft having an internal chamber,
wherein the electrical leads and the common ground electrical lead extend through the internal chamber of the shaft and electrical current is applied to each of the plurality of resistive heating elements directly through the electrical leads to provide individual control of the plurality of resistive heating elements.

2. The heater assembly according to claim 1, wherein the plurality of resistive heating elements comprises n resistive heating elements and n+1 electrical leads, wherein the n resistive heating elements is two or more resistive heating elements.

3. The heater assembly according to claim 1, wherein the at least one resistive heater comprises a first resistive heating element and a second resistive heating element extending in a physical series connection along the perimeter of the substrate, a first positive electrical lead in communication with a positive end of the first resistive heating element, a second positive electrical lead in communication with a positive end of the second resistive heating element, and a common electrical lead in communication with a negative end of the first resistive heating element and a negative end of the second resistive heating element.

4. The heater assembly according to claim 1, wherein each of the plurality of resistive heating elements are isolated from each other.

5. The heater assembly according to claim 1, wherein the at least one resistive heater is a cable heater.

6. The heater assembly according to claim 1, wherein the at least one resistive heater is selected from the group consisting of a tubular heater, a layered heater, and a foil heater.

7. The heater assembly according to claim 1, wherein the at least one resistive heater is embedded within the substrate.

8. The heater assembly according to claim 1, wherein the substrate is one piece.

9. The heater assembly according to claim 1, wherein the at least one resistive heater is attached to an exterior surface of the substrate.

10. The heater assembly according to claim 1, wherein the substrate is of metal material.

11. The heater assembly according to claim 1 further comprising electrical leads in communication with the plurality of heating zones.

12. The heater assembly according to claim 1 further comprising a 2-wire controller operable to independently control the plurality of heating zones, wherein the resistive heater defines a material that functions as a heater element and as a temperature sensor.

13. The heater assembly according to claim 1, wherein the plurality of resistive heating elements provide primary heating of the substrate.

14. The heater assembly according to claim 13, wherein heating of the substrate is provided only by the plurality of resistive heating elements.

15. A thermal system comprising:
a controller;
a substrate, wherein the substrate is in the form of a pedestal;
a plurality of resistive heating elements having a common ground electrical lead and defining a plurality of heating zones disposed along a perimeter of the substrate, wherein the common ground electrical lead is in communication with a common ground, and wherein the plurality of heating zones are independently controlled by the controller to provide azimuthal temperature control of the substrate;
electrical leads in communication with the plurality of heating zones; and
a shaft is secured to and extending from a lower surface of the pedestal, the shaft having an internal chamber,
wherein the electrical leads and the common ground electrical lead extend through the internal chamber of the shaft and electrical current is applied to each of the plurality of heating zones directly through the electrical leads to provide individual control of the plurality of heating zones.

16. The thermal system according to claim 15, wherein the controller is a 2-wire controller.

17. The thermal system according to claim 15, wherein the plurality of resistive heating elements comprises n resistive heating elements and n+1 electrical leads, wherein the n resistive heating elements includes two or more resistive heating elements.

18. The thermal system according to claim 15, wherein the plurality of resistive heating elements comprises a first resistive heating element and a second resistive heating element extending in a physical series connection along the perimeter of the substrate, a first positive electrical lead in communication with a positive end of the first resistive heating element, a second positive electrical lead in communication with a positive end of the second resistive heating element, and a common electrical lead in communication with a negative end of the first resistive heating element and a negative end of the second resistive heating element.

* * * * *